United States Patent
Shim et al.

(10) Patent No.: US 12,211,863 B2
(45) Date of Patent: Jan. 28, 2025

(54) RELIABLE SEMICONDUCTOR PACKAGES

(71) Applicant: UTAC Headquarters Pte. Ltd., Singapore (SG)

(72) Inventors: Il Kwon Shim, Singapore (SG); Jeffrey Punzalan, Singapore (SG); Emmanuel Espiritu, Singapore (SG); Allan Ilagan, Singapore (SG); Teddy Joaquin Carreon, Singapore (SG)

(73) Assignee: UTAC Headquarters Pte Ltd., Singapore (SG)

( * ) Notice: Subject to any disclaimer, the term of this patent is extended or adjusted under 35 U.S.C. 154(b) by 530 days.

(21) Appl. No.: 17/394,365

(22) Filed: Aug. 4, 2021

(65) Prior Publication Data
US 2021/0366963 A1    Nov. 25, 2021

Related U.S. Application Data

(63) Continuation-in-part of application No. 16/687,659, filed on Nov. 18, 2019, now Pat. No. 11,177,301.
(Continued)

(51) Int. Cl.
| | | |
|---|---|---|
| *H01L 27/14* | (2006.01) | |
| *H01L 23/00* | (2006.01) | |
| *H01L 27/146* | (2006.01) | |

(52) U.S. Cl.
CPC ........ *H01L 27/14618* (2013.01); *H01L 24/32* (2013.01); *H01L 24/73* (2013.01);
(Continued)

(58) Field of Classification Search
CPC . H01L 23/5389; H01L 23/5385; H01L 21/56; H01L 21/561; H01L 21/565;
(Continued)

(56) References Cited

U.S. PATENT DOCUMENTS

| | | | |
|---|---|---|---|
| 2016/0056057 A1* | 2/2016 | Yu ............. | H01L 24/19 257/774 |
| 2016/0079220 A1* | 3/2016 | Lin ............. | H01L 25/0655 257/737 |

FOREIGN PATENT DOCUMENTS

JP         2006013174 A      1/2006

* cited by examiner

*Primary Examiner* — Moin M Rahman
(74) *Attorney, Agent, or Firm* — HORIZON IP PTE LTD.

(57) ABSTRACT

A semiconductor package is disclosed. The package includes a package substrate having top and bottom major package substrate surfaces, the top major package surface including a die region. A die having first and second major die surfaces is attached onto the die region. The second major die surface is attached to the die region. The first major die surface includes a sensor region and a cover adhesive region surrounding the sensor region. The package also includes applying a cover adhesive to the cover adhesive region on the first major die surface. A protective cover with first and second major cover surfaces and side surfaces is attached to the die using the cover adhesive. The second major cover surface contacts the cover adhesive. The protective cover covers the sensor region. The protective cover includes a recessed structure on the second major cover surface. The recessed structure is located above die bond pads on the die to create an elevated space over peak portions of wire bonds on the die bond pads. An encapsulant is disposed on the package substrate to cover exposed portions of the package substrate, die and bond wires and side surfaces of the protective cover, while leaving the first major cover surface exposed.

20 Claims, 8 Drawing Sheets

Related U.S. Application Data

(60) Provisional application No. 62/768,990, filed on Nov. 19, 2018.

(52) U.S. Cl.
CPC ........ *H01L 24/83* (2013.01); *H01L 27/14683* (2013.01); *H01L 24/06* (2013.01); *H01L 24/33* (2013.01); *H01L 24/48* (2013.01); *H01L 24/49* (2013.01); *H01L 2224/06155* (2013.01); *H01L 2224/32013* (2013.01); *H01L 2224/3207* (2013.01); *H01L 2224/32111* (2013.01); *H01L 2224/32225* (2013.01); *H01L 2224/33181* (2013.01); *H01L 2224/48091* (2013.01); *H01L 2224/48108* (2013.01); *H01L 2224/48227* (2013.01); *H01L 2224/49171* (2013.01); *H01L 2224/73215* (2013.01); *H01L 2224/73265* (2013.01); *H01L 2224/83191* (2013.01); *H01L 2224/83385* (2013.01); *H01L 2924/1615* (2013.01); *H01L 2924/16235* (2013.01); *H01L 2924/182* (2013.01); *H01L 2924/18301* (2013.01); *H01L 2924/20641* (2013.01)

(58) Field of Classification Search
CPC ... H01L 25/16; H01L 24/19; H01L 21/76802; H01L 21/31053; H01L 25/50; H01L 21/6835; H01L 24/24; H01L 25/0655; H01L 21/568; H01L 2224/73267; H01L 2221/68318; H01L 2221/68381; H01L 2224/16265; H01L 23/3128; H01L 23/5383; H01L 2221/68372; H01L 23/49816; H01L 2224/0401; H01L 2224/04105; H01L 2224/83005; H01L 2224/12105; H01L 2224/16145; H01L 2224/16227; H01L 2224/24195; H01L 2224/32145; H01L 2224/32225; H01L 2224/73204; H01L 2224/73259; H01L 2224/81005; H01L 2224/92125; H01L 2924/15311; H01L 2924/18161; H01L 2924/18162; H01L 2924/19041; H01L 2924/19042; H01L 2924/19043; H01L 2924/19102; H01L 2224/92224; H01L 2924/19104; H01L 2221/68359; H01L 2224/24137; H01L 2224/0603; H01L 2224/06181; H01L 24/06; H01L 24/13; H01L 2224/81815; H01L 2224/13101; H01L 24/73; H01L 24/16; H01L 24/81; H01L 24/92; H01L 2224/82001; H01L 24/82; H01L 24/20; H01L 23/4012; H01L 2225/06541; H01L 23/5226; H01L 23/538; H01L 24/76; H01L 25/105; H01L 23/481; H01L 23/3107; H01L 23/49838; H01L 23/49822; H01L 23/49827; H01L 21/4857; H01L 21/4853; H01L 2225/1023; H01L 2225/1041; H01L 2225/1058; H01L 2221/68345; H01L 25/071; H01L 25/072; H01L 23/5283
See application file for complete search history.

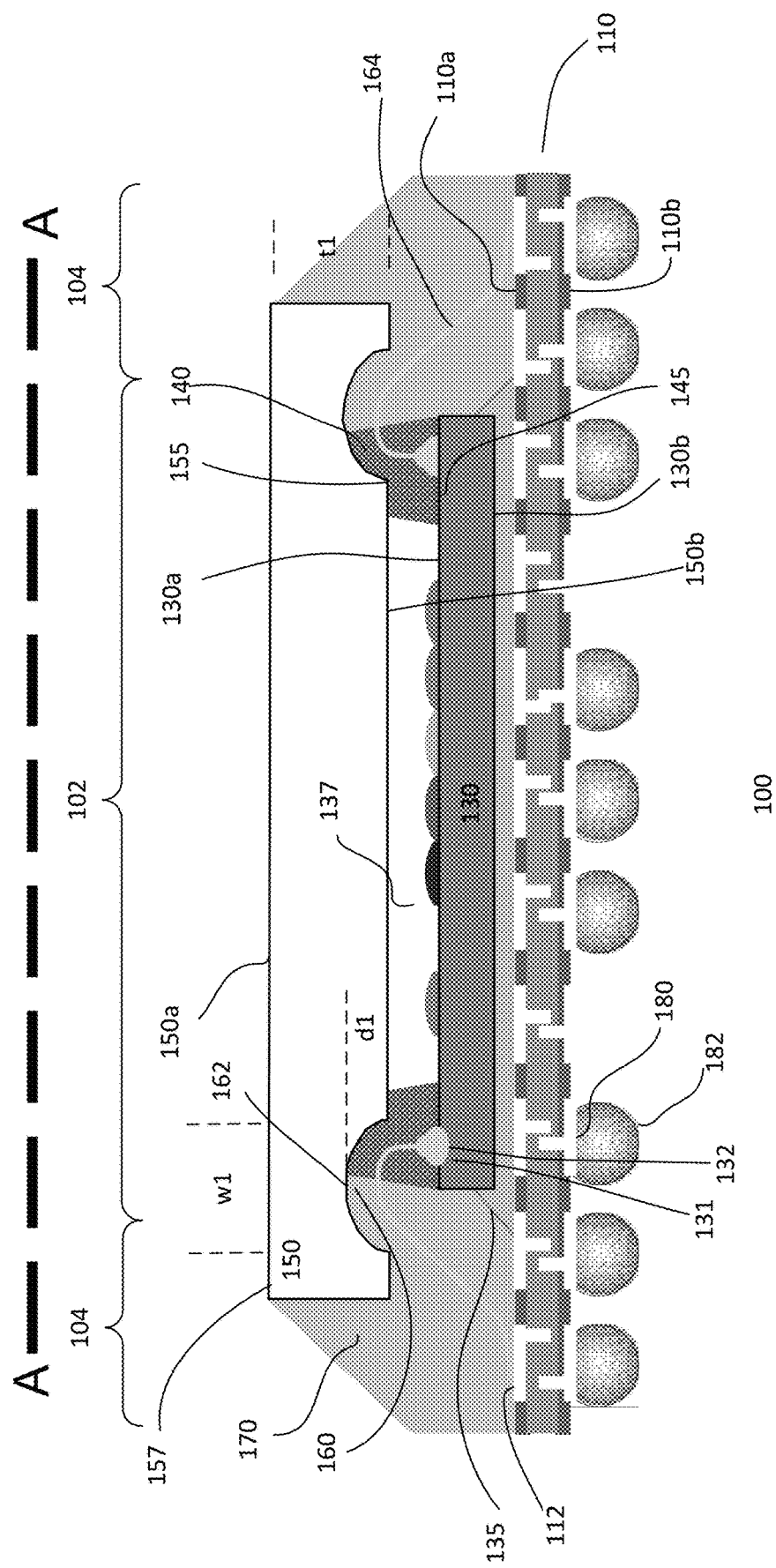
Fig. 1b₁

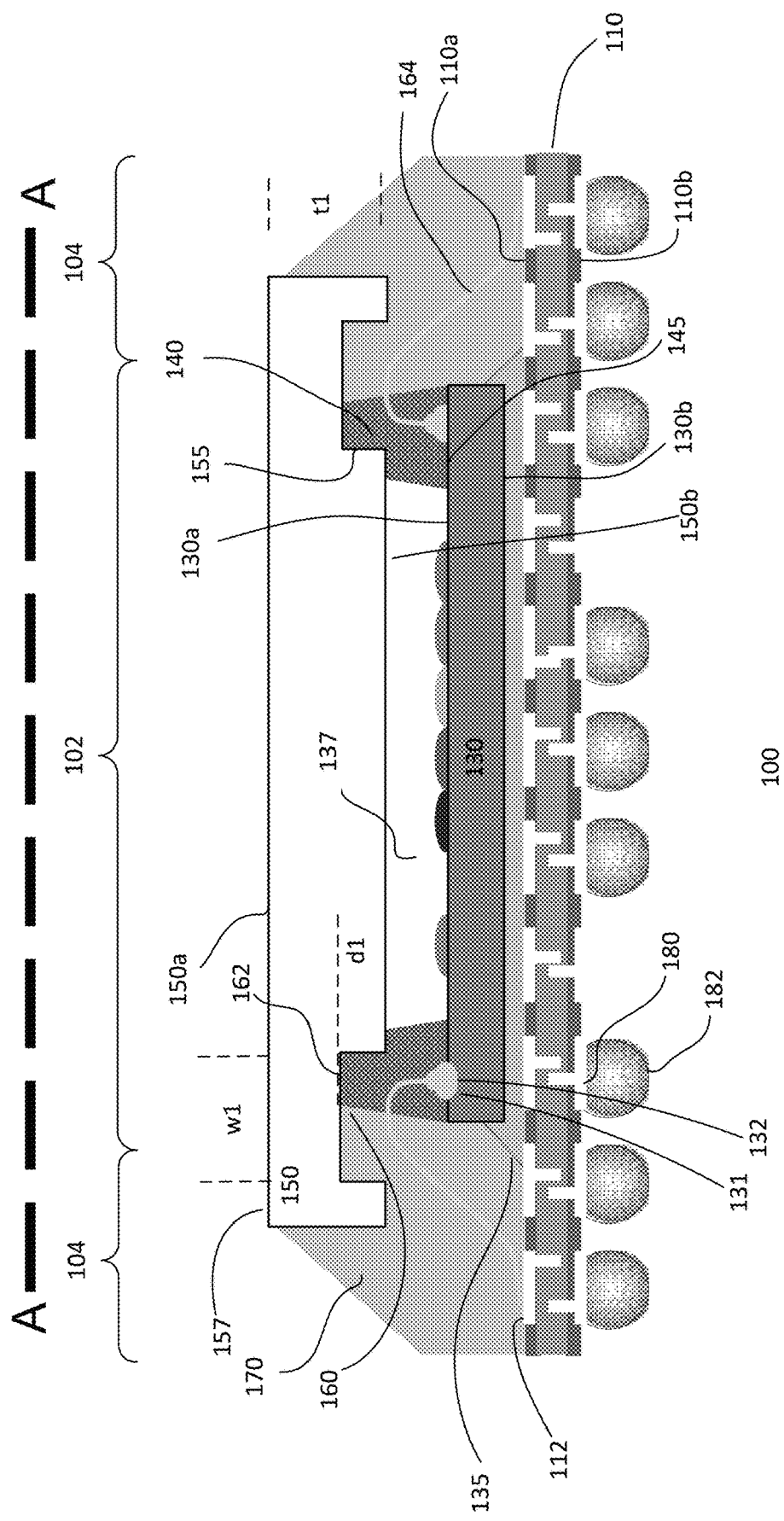
Fig. 1b₂

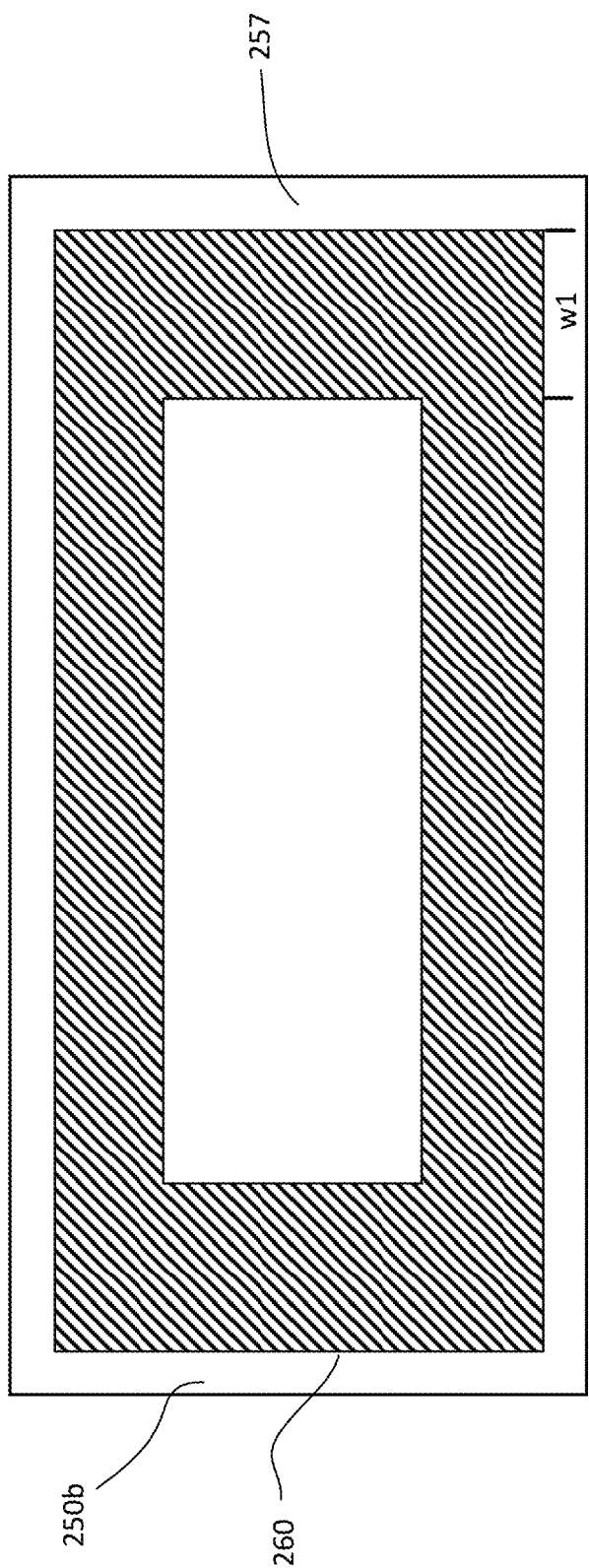
Fig. 2a
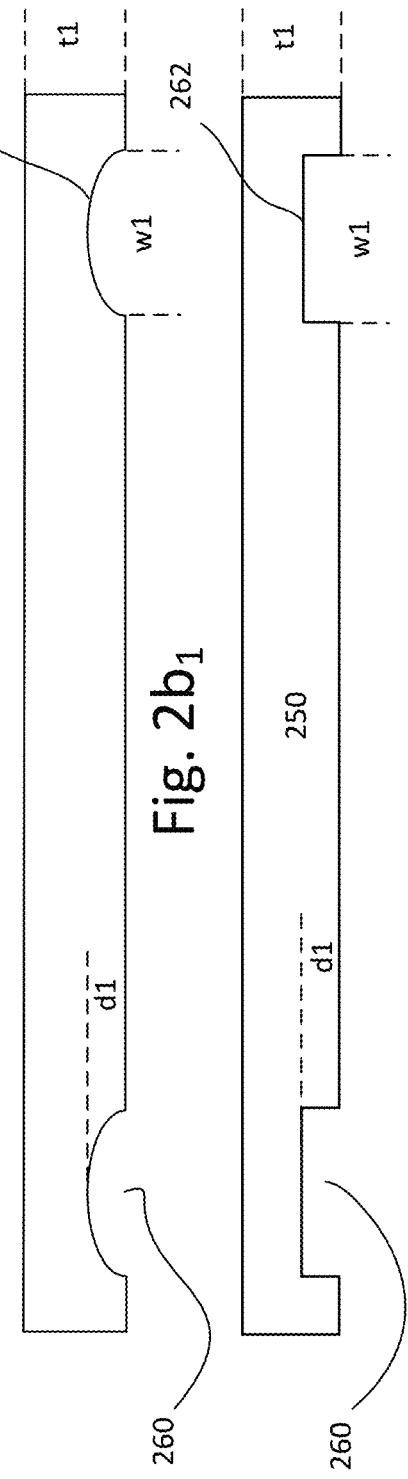
Fig. 2b₁
Fig. 2b₂

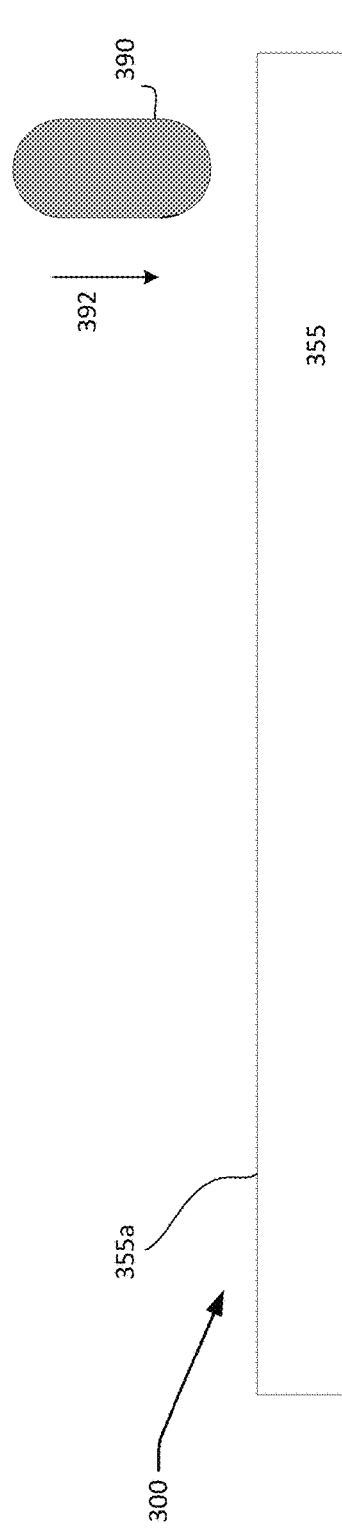
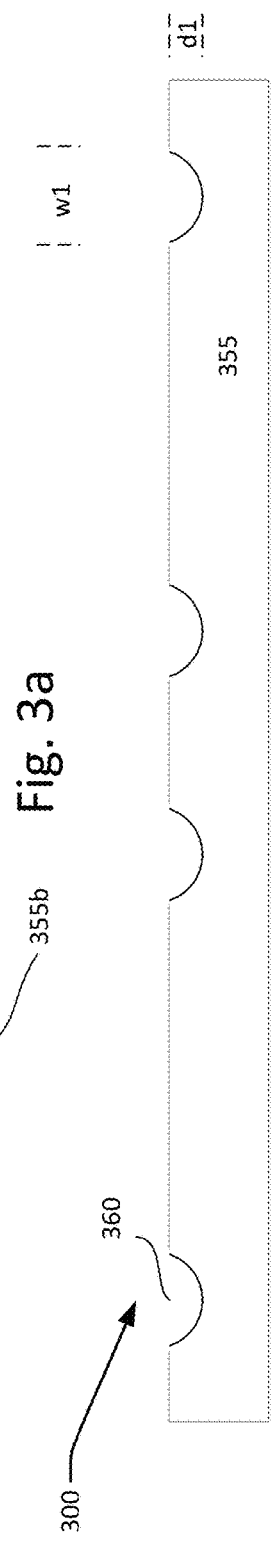
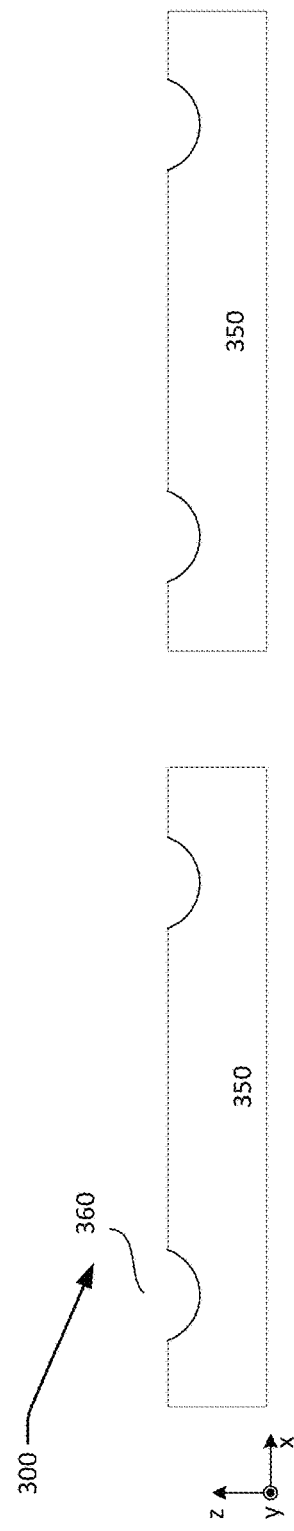
Fig. 3a
Fig. 3b
Fig. 3c

RELIABLE SEMICONDUCTOR PACKAGES

CROSS-REFERENCE TO RELATED APPLICATION

This application is a continuation-in-part of co-pending U.S. patent application Ser. No. 16/687,659, filed on Nov. 18, 2019, which claims the benefit of U.S. Provisional Application No. 62/768,990, filed on Nov. 19, 2018. The disclosures of all of which are incorporated herein by reference in their entireties for all purposes.

FIELD OF THE INVENTION

The present disclosure relates to semiconductor packages and manufacturing methods of such packages. In particular, the present disclosure relates to semiconductor packages for sensor chips with covers having reduced package height and covers with increased lateral dimensions. More specifically, the present disclosure relates to semiconductor packages for image sensor chips with covers with reduced package height and covers with increased lateral dimensions.

BACKGROUND

Sensing devices generally include sensor chips used for receiving non-electrical signals from the surrounding environment. A sensor chip converts the non-electrical signals received into electrical signals that are transmitted to a printed circuit board. For example, an image sensor chip converts incoming light into an electrical signal that can be viewed, analyzed, or stored. Image sensors may be used in electronic imaging devices of both analog and digital types, which include digital cameras, camera modules and medical imaging equipment. Most commonly used image sensors may include semiconductor charge-coupled devices (CCD) or active pixel sensors in complementary metal-oxide-semiconductor (CMOS) or N-type metal-oxide-semiconductor (NMOS, Live MOS) technologies.

Typically, a transparent cover is provided over the sensor area of the image sensor die. The cover permits light to reach the optically active area of the die while also protecting the die from the environment. An adhesive may be employed to attach the cover to the die. The adhesive creates a height between the bottom surface of the cover and die active surface. However, it is challenging to form wire bonds on die bond pads disposed on the die active surface due to the limitation of the height between the bottom surface of the cover and the die active surface.

From the foregoing discussion, there is a desire to provide a higher clearance height between cover and wire bonds to improve the reliability and manufacturing productivity of semiconductor packages.

SUMMARY

Embodiments generally relate to semiconductor packages and methods for manufacturing semiconductor packages.

In one embodiment, a method for forming a semiconductor package is disclosed. The method includes providing a package substrate having top and bottom major package substrate surfaces, the top major package surface including a die region. A die having first and second major die surfaces is attached onto the die region. The second major die surface is attached to the die region. The first major die surface includes a sensor region and a cover adhesive region surrounding the sensor region. The method also includes applying a cover adhesive to the cover adhesive region on the first major die surface. A protective cover with first and second major cover surfaces and side surfaces is attached to the die using the cover adhesive. The second major cover surface contacts the cover adhesive. The protective cover includes a recessed structure on the second major cover surface. The recessed structure is located above die bond pads on the die to create an elevated space over peak portions of wire bonds on the die bond pads.

In another embodiment, the semiconductor package includes a package substrate having top and bottom major package substrate surfaces. The top major package surface includes a die region and a die disposed on the die region. The die includes first and second major die surfaces, the second major die surface being attached to the die region, the first major die surface including a sensor region and a cover adhesive region surrounding the sensor region. The semiconductor package also includes a cover adhesive disposed on the cover adhesive region on the first major die surface. A protective cover having first and second major cover surfaces and side surfaces is also included. The second major cover surface is attached to the die by the cover adhesive. The protective cover includes a recessed structure on the second major cover surface. The recessed structure is located above die bond pads on the die to create an elevated space over peak portions of wire bonds on the die bond pads. The semiconductor package also includes an encapsulant which covers exposed portions of the package substrate, die and bond wires and side surfaces of the protective cover while leaving the first major cover surface exposed.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which:

FIG. 2a and FIGS. $2b_1$-$2b_2$ show simplified bottom and side views of various embodiments of a cover for a semiconductor package;

FIGS. 3a-3c show simplified cross-sectional views of an embodiment of a process for forming a cover for a semiconductor package;

DETAILED DESCRIPTION

Embodiments described herein generally relate to semiconductor packages and methods for forming the semiconductor packages. In some embodiments, the semiconductor package includes a sensor chip used for sensing environmental signals, such as optical signals, audio signals, or the like. The semiconductor package includes a cover over the sensor chip. The semiconductor package may include other types of chips with a cover thereover. The semiconductor package may be incorporated into electronic devices or equipment, such as sensing devices, navigation devices, telecommunication devices, computers and smart devices.

Figure 1A:
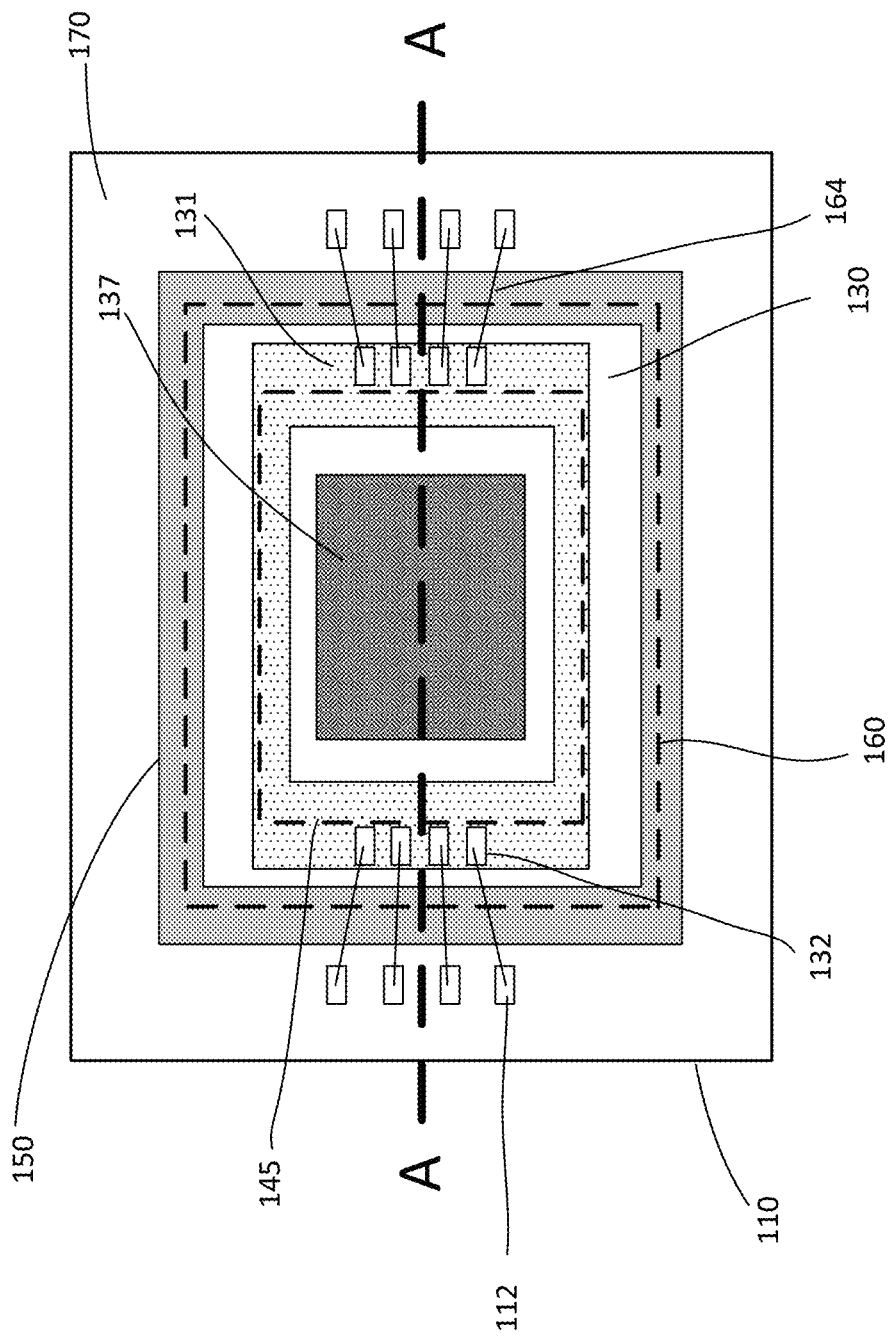
FIG. 1a and FIGS. $1b_1$-$1b_2$ show simplified top and cross-sectional views of various embodiments of a semiconductor package.

FIG. 1a and FIGS. $1b_1$-$1b_2$ show simplified top and cross-sectional views along A-A of various embodiments of semiconductor packages. The various embodiments include common elements. Common elements may not be described or described in detail.

A semiconductor package 100 is shown. The semiconductor package 100 includes a package substrate 110 having opposing first and second major surfaces 110a and 110b. The first major surface 110a may be referred to as the top substrate surface and the second major surface 110b may be referred to as the bottom substrate surface. The top surface serves as a bonding surface for a die 130. Other designations for the surfaces may also be useful.

The package substrate may be a multi-layer substrate. For example, the package substrate includes a stack of electrically insulating substrate layers. The different layers of the package substrate 110 may be laminated or built-up. In one embodiment, the package substrate 110 is a laminate-based substrate including a core or intermediate layer sandwiched between top and bottom substrate layers. Other types of substrate, including ceramic and leadframe substrates, may also be useful. It is understood that the package substrate 110 may have various configurations, depending on design requirements.

The top surface of the package substrate may be defined with die and non-die regions 102 and 104. The non-die region 104, for example, surrounds the die region 102. For example, the die region may be centrally disposed within the top surface of the package substrate with the non-die region surrounding it. Providing a die region which is not centrally disposed within the top package surface may also be useful.

The top surface of the package substrate may include package bond pads 112. In some embodiments, the top surface of the package substrate includes package bond pads disposed outside the die attach region. The bottom package surface may include package pads 180 and package contacts 182. The package pads, for example, are electrically coupled to the package bond pads of the top surface of the package substrate. For example, each package pad is coupled to its respective package bond pad. The package substrate may include one or more conductive layers embedded therein. The conductive layers may form interconnect structures including conductive traces and contacts for interconnecting the package contacts to package bond pads.

A die 130 is attached to the die region of the top surface of the package substrate. The die, for example, includes first and second opposing major die surfaces 130a and 130b. The first major surface may be referred to as a top or active die surface and the second major surface may be referred to as a bottom or inactive die surface. In one embodiment, the die is a sensor chip. In one embodiment, the die is an image sensor chip. Other types of dies may also be useful. For example, the die may be a thermal or infrared (IR) image sensor chip. Other types of chips, for example, non-sensor chips, may also be useful.

The die, as shown, is attached to the die region of the package substrate by a die adhesive 135. The adhesive may be a curable glue or adhesive tape. For example, a curing process may be performed to permanently attach the die to the die region. Other types of die adhesives may also be useful to attach the die to the die region. The bottom surface of the die, for example, is attached to the die region. For example, the inactive die surface is attached to the die region of the package substrate.

In one embodiment, the active die surface includes a sensor region 137. In the case of an image sensor chip, the sensor region may include a photosensitive sensor that may capture image information in response to light. The image sensor may be, for example, a CMOS or CCD type image sensor. In one embodiment, the sensor region includes an array of sensors. For example, each sensor may correspond to a pixel of an image. The sensor chip may include CMOS components embedded in the chip for controlling the sensor chip. Other configurations of chips may also be useful.

The active die surface may include die bond pads 132 disposed outside of the sensor region. For example, the die bond pads may be disposed on the non-sensor region of the active surface of the die. The die bond pads provide external electrical connections to various components of the chip. In one embodiment, bond wires 164 couple the package bond pads to the die bond pads. The bond wires enable external connections to the internal circuitry of the die.

A protective cover 150 is disposed on the die over the sensor region. The protective cover includes first or top and second or bottom opposing cover surfaces 150a and 150b with sides or edges. The bottom cover surface 150b, for example, faces the die. The protective cover, for example, may be a glass cover which enables light to penetrate to the sensor region 137. Other types of protective covers may also be useful. For example, the cover may depend on the type of sensor.

An adhesive 140 may be employed to attach the protective cover over the die. The adhesive, for example, may be referred to as a cover adhesive for bonding the cover to the active surface of the die. In one embodiment, the top die surface includes an adhesive region 145 on which the adhesive 140 is disposed. The adhesive region, for example, surrounds the sensor region 137. In one embodiment, as shown, the adhesive region is disposed on a periphery portion of the die active surface with a gap exposed between the sensor region and inner sides of the adhesive region. For example, an adhesive ring 140 is disposed on the adhesive region surrounding the sensor region for attaching the protective cover to the die. The adhesive may be a curable adhesive. For example, a curing process may be performed to permanently attach the cover to the die. The curing process, for example, may be performed to permanently attach the die to the die region of the package substrate and the cover to the die.

The protective cover sufficiently covers the sensor region. Preferably, the protective cover has a rectangular shape which is larger than the sensor region, ensuring that it sufficiently covers the sensor region. Providing a protective cover with other shapes may also be useful. The protective cover forms a vacuum cavity over the sensor region. For example, the protective cover hermetically seals the sensor region.

As discussed, the top die surface includes die bond pads 132. The die bond pads, for example, are disposed on a pad region 131 on the top or active die surface. As shown, the die bond pads are disposed within the adhesive region 145. For example, the pad region with the die bond pads is disposed within the cover adhesive region. As such, the adhesive covers the die bond pads and portions of the wire bonds in the adhesive region. The bond pads, for example, are disposed on opposing sides of the sensor region within the adhesive region. This advantageously reduces the footprint of the package. Other configurations of die bond pads and wire bonds may also be useful. For example, the die bond pads may be disposed on the active die surface between the sensor region and the adhesive region or between the edge of the die and the adhesive region. In addition, the die bond pads may be disposed on one side or more than 2 opposing sides of the sensor region.

In one embodiment, the bottom surface of the protective cover includes a bonding region 155. The bonding region, for example, may be referred to as a cover bonding region. The bonding region is aligned with the adhesive region 145 on the active surface of the die. For example, the bonding region is a continuous ring-shaped region aligned with the cover adhesive region to which the adhesive 140 is bonded on the cover. In the case that the pad region 131 is disposed within the cover adhesive region, the cover bonding region 155 is also aligned with the pad region 131 on the die surface. Other configurations or arrangements of the the cover bonding region may also be useful.

In one embodiment, the bottom surface of the protective cover includes a relief or recessed structure 160. The recessed structure accommodates the upper portion of the wire bonds without touching or contacting them to avoid causing damage to the wire bonds. The upper portion, for example, may be from about 10-30 percent of the total height of the wire bonds. For example, the upper portion may be about 10-40 um for a total wire loop height of about 100-140 um. Providing a recessed structure that accommodates other amounts of the wire bonds may also be useful. By providing the protective cover with a recessed structure to accommodate an upper portion of the wire bonds, the overall package height of the package can be reduced without damaging the wire bonds.

The recessed structure, in one embodiment, may have a rectangular-shaped, semi-circular shaped, or arc-shaped cross-section. For example, a surface 162 of the recessed structure 160 may be a planar, a semi-circular or an arc-shaped surface. As shown, in FIG. 1b1, the recessed structure 160 includes a semi-circular form while FIG. 1b2 shows a recessed structure with a rectangular form. Other configurations of the surface of the recess structure may also be useful. For example, the surface of the recessed structure may be a regular or an irregular geometric shape.

In one embodiment, the recessed structure has a dimension configured to accommodate the upper portion of the wire bonds. For example, a width w1 and a depth d1 of the recessed structure should be sufficient to accommodate the upper portion of the wire bonds without contacting them. For example, the depth is above the peak of the loop of the wire bonds and the width is sufficient to avoid contacting the upper portion of the loop of the wire bonds. In addition, a thickness t1 of the cover should be sufficient to accommodate the recessed structure without compromising its mechanical stability. In one embodiment, the thickness t1 of the cover may be about 400-500 um while the width w1 of the recessed structure may be about 40-200 um and the depth d1 of the recessed structure may be about 100-500 um. Other dimensions, such as t1, w1 and d1, for the cover and recessed structure may also be useful. For example, other thicknesses t1, widths w1 and depths d1 may be useful and may depend on the wire loop height and location of the bond pads.

As shown, the die bond pads are disposed in the adhesive region 145. For example, the adhesive region coincides with the cover bonding region 155 on the bottom surface 150b of the cover. The recessed structure also conincides with the adhesive region 145. For example, the recessed structure 160 is a continuous rectangular ring-shaped recessed structure disposed over the continuous ring-shaped adhesive region 145. In one embodiment, the recessed structure accommodates the adhesive 140 and the upper portion of the wire bonds. For example, the recessed structure surrounds the periphery of the bottom surface of the cover over the adhesive region.

The recessed structure, as shown, accommodates a portion of the adhesive and extends outwards to accommodate the wire bonds. For example, the portion of the adhesive with the wire bonds is disposed in the recessed structure. This may result in about 1-40% of the width of the adhesive being disposed outside of the recessed structure and contacts the bottom surface 150b of the cover. In other embodiments, about 20-40% of the adhesive is disposed outside of the recessed structure. Other proportions of adhesive being disposed outside and inside the recessed structure may also be useful. Providing a portion of the adhesive within and outside of the recessed structure, interlocking is created with the adhesive and protective cover to improve adhesion. The recessed structure extends outward to accommodate the wire bonds.

As shown, the cover includes an extension region 157 extending from the recessed structure to the edge of the cover. The extension region, for example, may be about 200 um wide. Other widths for the extension region may also be useful. In some cases, the cover does not include an extension region. For example, the edge of the cover is defined by the recessed structure. Other configurations of the recessed structure may also be useful.

In other embodiments, the adhesive region adhesive may be adjacent to the recessed structure. For example, the adhesive does not interlock with the recessed structure. For example, the recessed structure only accommodates a portion of the wire bonds and not the adhesive. For example, 0% of the adhesive is disposed within the recessed structure. In some embodiments, the pad region is disposed outside of the adhesive region. In such cases, the recessed structure is disposed outside of the adhesive region. The recessed structure may be a segmented recessed structure defined to only accommodate the wire bonds. Continuous recessed structures may be formed on the back surface of the cover by, for example, sawing. Other techniques for forming the recessed structures may also be useful. For example, etchig using an etch mask, laser ablation or sanbasting may also be employed. Such techniques may be employed to form both continuous as well as segmented recessed structures.

An encapsulant 170 is disposed on the package substrate. The encapsulant 170 covers the package substrate, exposed portions of the die and wire bonds, and sides of the protective cover 150. For example, the encapsulant is configured to adhere to the sides of the cover while leaving the top of the cover exposed. For example, the encapsulant is above the top package surface of package substrate but at or below about the top surface of the cover. The encapsulant may be a mold compound. Other types of encapsulant may also be useful.

As shown, the topmost surface of the encapsulant 170 may be formed slightly below the top surface of the protective cover 150 and slopes downwardly from the protective cover towards a perimeter of the non-die region 104. The encapsulant may be formed by, for example, dispensing. For example, a liquid encapsulant is used. The material for forming the encapsulant may include epoxy resin. Other materials and techniques for forming the encapsulant may also be useful.

As described, the cover is provided with a recessed structure for accommodating an upper portion of wire bonds. This advantageously enables the overall height of the package to be reduced since the cover can be configured lowered over the die without damaging the wire bonds. In addition, package height can be reduced without compromising wire bonds reliability, such as reducing their loop height. Another advantage of the cover with the recessed structure is that it enables a larger cover to be used without enlarging the footprint of the package. Larger cover enables a larger spectrum of images to be captured by an image sensor die.

FIG. 2a and FIGS. $2b_1$-$2b_2$ show simplified bottom and cross-sectional views of various embodiments of a cover for a semiconductor package. The semiconductor package is, for example, the same or similar to those described in FIGS. $1a$-$1b_2$. For example, the cover is attached to a die, such as a sensor die, of a semiconductor package having a semiconductor chip mounted on a package substrate. Common elements and features may not be described or described in detail.

In one embodiment, as shown in FIG. 2a, the recessed structure is a continuous rectangular ring-shaped recessed structure. The recessed structure is disposed over the pad region on an active surface of a die with bond pads. In one embodiment, the pad region is disposed within an adhesive region on which an adhesive is disposed for bonding the cover to the die. In such cases, the recessed structure is disposed over the adhesive region. In one embodiment, the recessed structure is configured to accommodate the adhesive and the upper portion of the wire bonds. For example, the recessed structure surrounds the periphery of the bottom surface of the cover over the adhesive region. Other configurations of the recessed structure may also be useful.

The recessed structure accommodates a portion of the adhesive and extends outwards to accommodate the wire bonds. For example, the portion of the adhesive with the wire bonds is disposed in the recessed structure. This may result in about 1-40% of the width of the adhesive being disposed outside of the recessed structure and contacts the bottom surface of the cover. In other embodiments, about 20-40% of the adhesive is disposed outside of the recessed structure. Other proportions of adhesive being disposed outside and inside the recessed structure may also be useful. Providing a portion of the adhesive within and outside of the recessed structure, interlocking is created with the adhesive and protective cover to improve adhesion. The recessed structure extends outward to accommodate the wire bonds.

As shown, the cover includes an extension region 257 extending from the recessed structure to the edge of the cover. The extension region, for example, may be about 200 um wide. Other widths for the extension region may also be useful. In some cases, the cover does not include an extension region. For example, the edge of the cover is defined by the recessed structure. Other configurations of the recessed structure may also be useful.

In other embodiments, the adhesive region adhesive may be adjacent to the recessed structure. For example, the adhesive does not interlock with the recessed structure. For example, the recessed structure only accommodates a portion of the wire bond and not the adhesive. For example, 0% of the adhesive is disposed within the recessed structure. In some embodiments, the pad region is disposed outside of the adhesive region. In such cases, the recessed structure is disposed outside of the adhesive region.

The recessed structure may be a segmented recessed structure defined to only accommodate the wire bonds. A continuous recessed structure may be formed on the back surface of the cover by, for example, sawing. Other techniques for forming the recessed structures may also be useful. For example, etching using an etch mask, laser ablation or sandblasting may also be employed. Such techniques may be employed to form both continuous as well as segmented recessed structures.

Figure 2C:
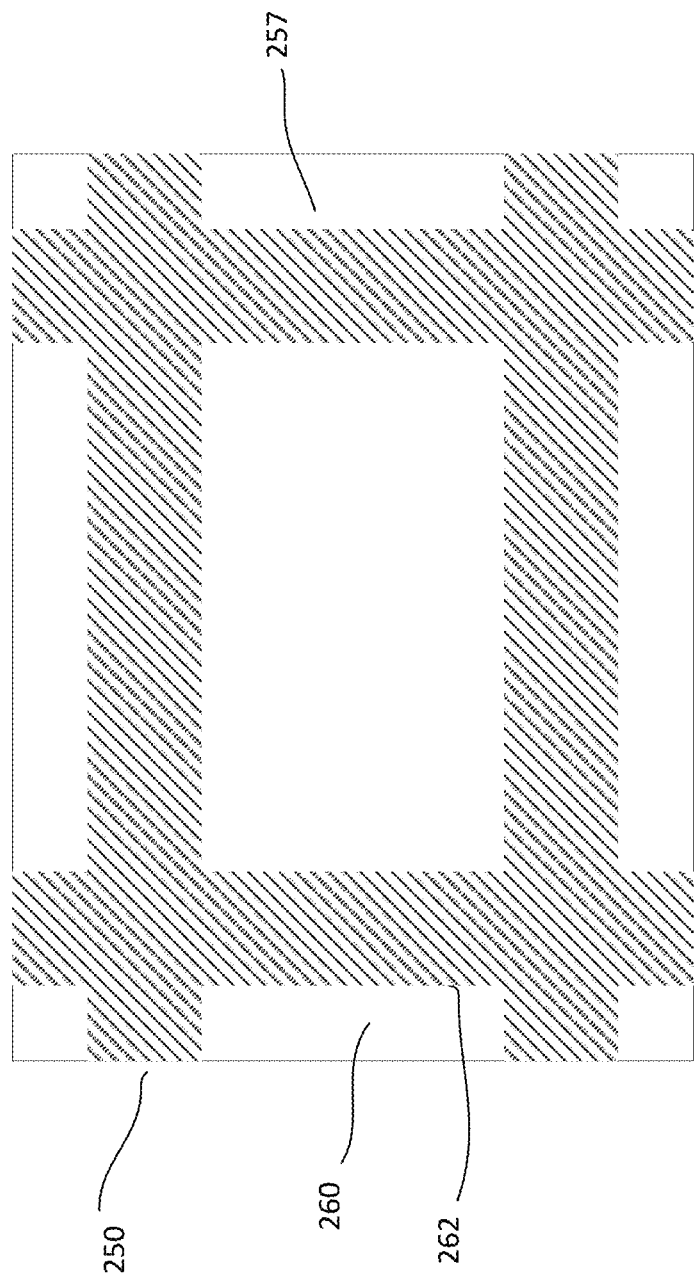
FIG. 2c shows a simplified bottom view of another embodiment of a cover with a recessed structure.

Multiple protective covers may be formed from a cover sheet, such as a glass sheet. The recess structures may be formed on a surface of the glass sheet. For example, the recess structures may be formed on a surface of the glass sheet which corresponds to the bottom protective cover surfaces. The recess structure may be formed by, for example, saw cuts in the x and y directions partially into the glass sheet. The depth of the saw cuts is the depth of the recessed structures. Then full cuts are made into the glass sheet in the x and y directions, singulating the glass sheet into individual protective covers, each with recessed structures, as shown in FIG. 2c. The saw may be employed to create the desired cross-sectional shape of the recessed structure.

As shown, in FIG. 2a, the recessed structure is formed by, for example, laser etching, sandblasting or mask and etch techniques. For example, the rectangular shaped recessed structures are formed on the glass sheet followed by singulating it into individual protective covers by sawing. In other embodiments, segmented recessed structures may be formed by laser etching, sandblasting or mask and etch techniques followed by singulating the glass sheet into individual covers by sawing.

As shown in FIGS. 2b1 and 2b2, the recessed structure, is configured with a rectangular, a semi-circular or an arc form. For example, a surface 262 of the recessed structure 260 may be a planar, a semi-circular or an arc shaped surface. As shown, in FIG. 2b1, the recessed structure 260 includes a semi-circular form while FIG. 2b2 shows a recessed structure with a rectangular form. Other configurations of the surface of the recess structure may also be useful. For example, the surface of the recessed structure may have regular or irregular geometric shapes.

In one embodiment, the recessed structure has a dimension configured to accommodate the upper portion of the wire bonds. For example, a width w1 and a depth d1 of the recessed structure should be sufficient to accommodate the upper portion of the wire bonds without contacting them. For example, the depth is above the peak of the loop of the wire bonds and the width is sufficient to avoid contacting the upper portion of the loop of the wire bonds. In addition, a thickness t1 of the cover should be sufficient to accommodate the recessed structure without compromising its mechanical stability. In one embodiment, the thickness t1 of the cover may be about 400-500 um while the width w1 of the recessed structure may be about 40-200 um and the depth d1 of the recessed structure may be about 100-500 um. Other dimensions, such as t1, w1 and d1, for the cover and recessed structure may also be useful. For example, other thicknesses t1, widths w1 and depths d1 may be useful and may depend on the wire loop height and/or location of the bond pads.

FIGS. 3a-3c show simplified cross-sectional views of an embodiment of a process for forming a cover for a semiconductor package. The semiconductor package is, for example, the same or similar to those described in FIGS.

1a-1b2. For example, the cover is attached to a die, such as a sensor die, of a semiconductor package having a semiconductor chip mounted on a package substrate. Common elements and features may not be described or described in detail.

Referring to FIG. 3a, the process includes providing a cover substrate 355. The cover substrate, for example, is employed to form a plurality of protective covers with a recess or recesses. The cover substrate, for example, is a cover sheet, such as a glass sheet, used in forming a plurality of covers. Other types of cover sheets may also be useful. As shown, the cover sheet includes opposing top and bottom cover substrate surfaces 355a and 355b. Typically the cover sheet may have a thickness of about 400-500 um. Other thicknesses may also be useful.

In one embodiment, the cover sheet is processed to form a plurality of protective covers having recessed structures 360, such as those described in FIGS. $1b_1$ and $2b_1$. In one embodiment, recessed structures are formed in the cover sheet using a saw 390. For example, the cover sheet is mounted onto a translatable and rotatable table for sawing. The saw, for example, is a rotary saw. To form the recessed structures, the saw cuts the cover sheet along first and/or second directions. The first and second directions, for example, are orthogonal directions, such as x and y directions. In the case that the recessed structure is formed only on opposing first sides or opposing second sides, the saw cuts along the first direction or the second direction. In the case that the recessed structure is formed on four sides, the saw cuts are formed along the first direction and the second direction.

The blade of the saw, for example, is configured to create the recessed structure. Depending on the width of the saw blade and the desired width w1 of the recess, a single cut or multiple cuts may be performed. For example, if the width of the saw blade is equal to w1, a single cut may be performed to create the recess structure. In the case where the saw blade is narrower than w1, multiple cuts may be performed to create the recessed structure. The saw may be configured to produce the desired cross-sectional profile. For example, the shape of the saw blade may be configured to produce a rectangular shaped, a semi-circular shaped or an arc shaped profile of the recessed structure. Other profile shapes may also be useful. In some cases, the cross-section shaped profile may be facilitated by controlling a depth of the saw blade cutting into the cover sheet to result in the desired profile with a desired depth d1. For example, the depth of the saw blade in −z direction, as indicated by the arrow 392, is controlled to result in the desired profile and the depth d1 of the recessed structure.

Referring to FIG. 3b, the saw cuts the cover sheet in the y direction to produce recessed structures 360 along the y direction. For example, after a first recess or groove corresponding to the recess structure is formed, the cover sheet is translated to make additional cuts to form additional grooves. For example, a pair of grooves may form opposing sides of a recess structure.

As shown, the profile of the grooves is a semi-circular or arc shaped profile. Other profile shapes may also be useful, for example, depending on the shape of the saw blade and the number of cuts per groove. After grooves are completed in the y direction, the cover sheet may be rotated to form grooves in the x direction. This, for example, forms grooves along the full length of the glass sheet in the x and y directions. As such, rectangular-shaped recess structures are created on the surface of the cover sheet.

Figure 3D:
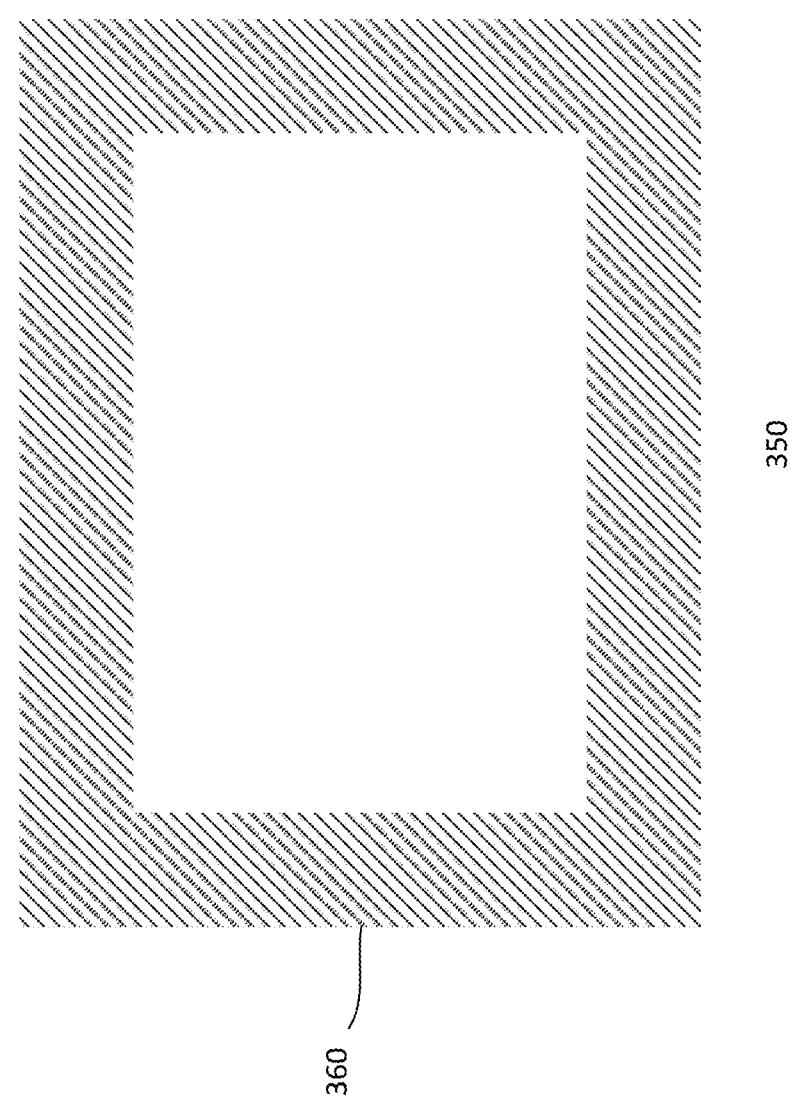
FIG. 3d shows a simplified bottom view of an embodiment of a cover with a recessed structure formed by the process of FIGS. 3a-3c.

In FIG. 3c, after the recess structures are formed, the cover sheet is singulated into individual covers 350. For example, the saw fully cuts the cover sheet in the x and y directions, separating it into individual covers. The resulting protective covers may be similar to that shown in FIG. 2c. In other embodiments, the recessed structure may form the edge of the protective cover, such as that shown in FIG. 3d.

Figure 4:
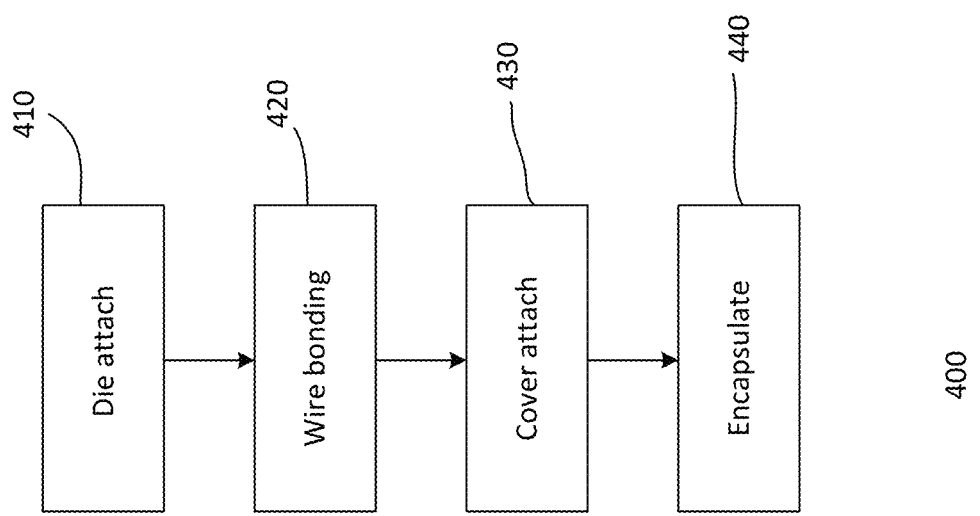
FIG. 4 shows a process flow for forming an embodiment of a semiconductor package.

FIG. 4 shows a process flow 400 for an embodiment of forming a semiconductor package. The package, for example, is similar to those described in FIGS. 1a-1b2. The package includes a protective cover similar to those described in FIGS. 2a, $2b_1$-$b_2$, 2c and FIG. 3d and those formed as described in FIGS. 3a-3c. Common elements may not be described or described in detail.

The process flow, for example, commences as 410. For example, the process flow, as shown, is at a stage where dies are formed on a wafer and diced to form individual dies, and protective covers are formed using a cover substrate and diced to form individual covers. The process includes providing a package substrate. The package substrate may include top and bottom major surfaces. The top surface of the package substrate may include a die region and package bond pads disposed outside of the die region. The bottom surface of the package substrate may include package contacts which are interconnected to the package bond pads on the opposing surface, for example, by one or more metal layers and via contacts embedded in the package substrate.

A die is attached to the die region, for example, by an adhesive. The adhesive may be an adhesive tape disposed on the die attach region. The die, for example, is temporarily attached to the die region. For example, a curing process may be performed to permanently attach the die to the die region.

The process, in one embodiment, forms wire bonds at 420. The wire bonds connect the die pads on the top surface of the die to package bond pads on the top surface of the package substrate.

A protective cover having a recessed structure is attached to the die at 430. The protective cover, for example, is a glass cover. Other types of protective cover may also be useful. An adhesive is applied onto the cover adhesive region on the die. The adhesive, for example, may be a UV-curable adhesive. Other types of adhesives may also be useful. The adhesive may be applied by dispensing. Other techniques for applying the adhesive may also be useful.

The cover adhesive region, for example, surrounds the sensor region of the die. The cover adhesive region, in one embodiment, is disposed on a periphery portion of the die. For example, the die bond pads are disposed within the cover adhesive region. In such cases, the adhesive is disposed on the die bond pads and portions of the bond wires thereover.

The protective cover is placed on the adhesive and the package is cured to permanently attach the cover to the die. The protective cover includes a recessed structure on the bottom surface of the protective cover, as discussed. The recessed structure may include one or more continuous or segmented recesses defined with a width w1 and a depth d1. The width and depth may be created by a saw blade, as discussed in FIGS. 3a-3c. When attached, the recessed structure should be not in contact with the bond wires on the die bond pads. Curing processes like UV curing and thermal curing may be performed to permanently attaching the protective cover to the die.

An encapsulant, such as epoxy resin, is formed over the package substrate at 440. The encapsulant covers the package substrate, exposed portions of the die and wire bonds, and sides of the protective cover. The epoxy may be formed by, for example, dispensing. Other techniques or materials may also be employed for the encapsulant. The encapsulant is cured thereafter.

Typically, the package substrate may include a leadframe with multiple package substrates. For example, the package substrates of the leadframe may be arranged in a matrix format, with rows and columns of package substrates. This facilitates parallel processing. For example, a plurality of dies are attached to the package substrates. After processing is completed, the leadframe is singulated, separating it into individual packages.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A semiconductor package comprising:
   a package substrate having top and bottom major package substrate surfaces, the top major package surface includes a die region;
   a die disposed on the die region, wherein the die includes first and second major die surfaces, the second major die surface is attached to the die region, the first major die surface includes a die adhesive region disposed on a periphery portion of the die;
   a cover adhesive disposed on the die adhesive region on the first major die surface;
   a protective cover having first and second major cover surfaces and side surfaces, wherein the second major cover surface is attached to the die by the cover adhesive, wherein the protective cover includes a recessed structure on the second major cover surface, the recessed structure is located above die bond pads on the die to create an elevated space over peak portions of wire bonds on the die bond pads; and
   an encapsulant, the encapsulant covers exposed portions of the package substrate, die and bond wires and side surfaces of the protective cover while leaving the first major cover surface exposed.

2. The package of claim 1 wherein the recessed structure is configured to coincide with the die adhesive region.

3. The package of claim 1 wherein the recessed structure comprises a rectangular, a semi-circular, or an arc cross-sectional profile.

4. The package of claim 1 wherein the first major die surface includes a pad region for disposing of the die bond pads, the recessed structure is disposed above the pad region.

5. The package of claim 1 wherein the die bond pads are disposed in the die adhesive region, the recessed structure is disposed above the die adhesive region.

6. The package of claim 1 wherein the recessed structure is configured to accommodate 10-30 percent of the overall height of the wire bonds.

7. The package of claim 1 wherein the protective cover has a thickness t1 of about 400-500 um.

8. The package of claim 7 wherein the peak portion of the recessed structure is about 10-40 um for a total wire loop height of about 100-140 um.

9. The package of claim 8 wherein the recessed structure has a depth d1 of about 40-200 um, and a width w1 of about 100 to 500 um.

10. A semiconductor package comprising:
    a package substrate having top and bottom major package substrate surfaces, the top major package surface includes
      a die region,
      package pads outside of the die region;
    a die disposed on the die region, wherein the die includes first and second major die surfaces, the second major die surface is attached to the die region, the first major die surface includes
      a die adhesive region disposed on a periphery portion of the die, and
      die pads;
    wire bonds electrically connecting the die pads to the package pads;
    an adhesive in the die adhesive region on the first major die surface;
    a protective cover having first and second major cover surfaces and side surfaces, wherein the second major cover comprises
      a recessed structure, the recessed structure is configured to accommodate peak portions of the wire bonds, and
      wherein the adhesive contacts the second major cover surface for attaching the protective cover to the die; and
    an encapsulant, the encapsulant covers exposed portions of the package substrate, the die and bond wires and side surfaces of the protective cover while leaving the first major cover surface exposed.

11. The package of claim 10 wherein the recessed structure is disposed at and surrounds a periphery of the second cover surface, the recessed structure is displaced away from the side cover surfaces.

12. The package of claim 11 wherein the recessed structure comprises a rectangular cross-sectional profile.

13. The package of claim 11 wherein the recessed structure comprises a semi-circular or an arc cross-sectional profile.

14. The package of claim 11 wherein the recessed structure overlaps the adhesive region.

15. The package of claim 10 wherein the recessed structure comprises a rectangular cross-sectional profile.

16. The package of claim 10 wherein the recessed structure comprises a semi-circular or an arc cross-sectional profile.

17. The package of claim 10 wherein the recessed structure overlaps the cover adhesive region.

18. The package of claim 10 wherein the die pads are disposed in the die adhesive region.

19. A protective cover for a semiconductor package comprising:
    first and second opposing major cover surfaces and side cover surfaces separating the first and second major surfaces;
    a cover adhesive region on the second major cover surface, the cover adhesive region is configured to contact a cover adhesive for attaching to a top surface of a die, wherein a bottom die surface of the die is disposed on a top package substrate surface of a package substrate of a semiconductor package; and
    a recessed structure on the second major cover surface, the recessed structure is configured to accommodate peak portions of wire bonds used to couple die pads on a top die surface of the die to package pads on the top package substrate surface of the package substrate of the semiconductor package.

20. The cover of claim 19 wherein the recessed structure is disposed at and surrounds a periphery of the second cover surface, the recessed structure is displaced away from the side cover surfaces.

* * * * *